(12) United States Patent
Reid et al.

(10) Patent No.: US 10,381,560 B2
(45) Date of Patent: *Aug. 13, 2019

(54) FABRICATION OF CORRELATED ELECTRON MATERIAL FILMS WITH VARYING ATOMIC OR MOLECULAR CONCENTRATIONS OF DOPANT SPECIES

(71) Applicant: ARM Ltd., Cambridge (GB)

(72) Inventors: Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/890,222

(22) Filed: Feb. 6, 2018

(65) Prior Publication Data

US 2018/0175292 A1 Jun. 21, 2018

Related U.S. Application Data

(63) Continuation of application No. 15/234,854, filed on Aug. 11, 2016, now Pat. No. 9,997,702.

(51) Int. Cl.
*H01L 45/00* (2006.01)
*H01L 27/24* (2006.01)
*H01L 49/00* (2006.01)

(52) U.S. Cl.
CPC ...... *H01L 45/1266* (2013.01); *H01L 27/2427* (2013.01); *H01L 27/2463* (2013.01); *H01L 45/04* (2013.01); *H01L 45/08* (2013.01); *H01L 45/1226* (2013.01); *H01L 45/1233* (2013.01); *H01L 45/1253* (2013.01);

(Continued)

(58) Field of Classification Search
CPC ......... H01L 45/04; H01L 45/06; H01L 45/10; H01L 45/12; H01L 45/122; H01L 45/1206; H01L 45/1233; H01L 45/1253; H01L 45/14; H01L 45/141; H01L 45/144; H01L 45/145; H01L 27/0688; H01L 27/0711; H01L 27/11514; H01L 27/11521; H01L 27/11551; H01L 27/11578; H01L 27/11597; H01L 27/2427; H01L 27/2463;

(Continued)

(56) References Cited

U.S. PATENT DOCUMENTS 7,298,640 B2 11/2007 Chen et al.
7,639,523 B2 12/2009 Celinska et al.

(Continued)

OTHER PUBLICATIONS

Notification of Transmittal of the International Search Report and the Written Opinion of the International Searching Authority, or the Declaration, App. No. PCT/GB2017/052364, dated Jan. 17, 2018, 22 pages.

(Continued)

*Primary Examiner* — Eduardo A Rodela
(74) *Attorney, Agent, or Firm* — Berkeley Law & Technology Group, LLP

(57) ABSTRACT

Subject matter disclosed herein may relate to fabrication of layered correlated electron materials (CEMs) in which a first group of one or more layers may comprise a first concentration of a dopant species, and wherein a second group of one or more layers may comprise a second concentration of a dopant species. In other embodiments, a CEM may comprise one or more regions of graded concentration of a dopant species.

18 Claims, 6 Drawing Sheets

(52) U.S. Cl.
CPC .......... *H01L 45/145* (2013.01); *H01L 45/146* (2013.01); *H01L 45/147* (2013.01); *H01L 45/1608* (2013.01); *H01L 45/1641* (2013.01); *H01L 49/003* (2013.01)

(58) Field of Classification Search
CPC ... H01L 27/2472; H01L 27/249; H01L 27/24; H01L 27/2409
See application file for complete search history.

(56) References Cited

U.S. PATENT DOCUMENTS

| | | |
|---|---|---|
| 7,778,063 B2 | 8/2010 | Brubaker et al. |
| 7,872,900 B2 | 1/2011 | Paz de Araujo et al. |
| 9,558,819 B1 | 1/2017 | Aitken et al. |
| 9,584,118 B1 | 2/2017 | Dao et al. |
| 9,589,636 B1 | 3/2017 | Bhavnagarwala et al. |
| 9,627,615 B1 | 4/2017 | Reid et al. |
| 9,997,702 B2 * | 6/2018 | Reid ................. H01L 45/04 |
| 2006/0113520 A1 | 6/2006 | Yamamoto |
| 2008/0011996 A1 | 1/2008 | Bednorz et al. |
| 2008/0106926 A1 | 5/2008 | Brubaker |
| 2008/0107801 A1 | 5/2008 | Celinska et al. |
| 2008/0191188 A1 | 8/2008 | Jeong |
| 2010/0328996 A1 | 12/2010 | Shih |
| 2012/0149164 A1 | 6/2012 | Kumar et al. |
| 2013/0200323 A1 | 8/2013 | Pham et al. |
| 2013/0207075 A1 | 8/2013 | Chiang |
| 2013/0214232 A1 | 8/2013 | Tendulkar et al. |
| 2013/0285699 A1 | 10/2013 | McWilliams et al. |
| 2016/0163978 A1 | 6/2016 | Paz de Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

Invitation to Pay Additional Fees and, Where Applicable, Protest Fee, App. No. PCT/GB2017/052364, dated Nov. 13, 2017, 16 pages.
U.S. Appl. No. 15/234,854, filed Aug. 11, 2016, 64 pages.
U.S. Appl. No. 15/234,854: Filing Receipt Aug. 23, 2016, 3 pages.
U.S. Appl. No. 15/234,854: Non-Final Rejection, dated May 2, 2017, 16 pages.
U.S. Appl. No. 15/234,854: Amendment/Req. Reconsideration-After Non-Final Reject, dated Jul. 31, 2017, 7 pages.
U.S. Appl. No. 15/234,854: Notice of Allowance and Fees Due, dated Nov. 1, 2017, 8 pages.
U.S. Appl. No. 15/234,854: Amendment after Notice of Allowance, dated Jan. 19, 2018, 6 pages.
U.S. Appl. No. 15/234,854: Amendment after Notice of Allowance, dated Jan. 29, 2018, 3 pages.
U.S. Appl. No. 15/234,854: Notice of Allowance and Fees Due, dated Jan. 29, 2018, 3 pages.
U.S. Appl. No. 15/234,854: Notice of Publication, dated Feb. 15, 2018, 1 page.
U.S. Appl. No. 15/234,854: Notice of Allowance and Fees Due, dated Mar. 13, 2018, 3 pages.

* cited by examiner

FABRICATION OF CORRELATED ELECTRON MATERIAL FILMS WITH VARYING ATOMIC OR MOLECULAR CONCENTRATIONS OF DOPANT SPECIES

BACKGROUND

Field

This disclosure relates to correlated electron devices, and may relate, more particularly, to the use of dopants in the fabrication of correlated electron devices, such as may be used in switches, memory circuits, and so forth, which may exhibit desirable impedance characteristics.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, personal digital assistants, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, endurance, and/or reliability. Moreover, there appears to be an ever-increasing need for memory and/or logic devices that exhibit characteristics of lower power and/or higher speed. However, conventional fabrication techniques, which may be well suited for certain types of memory and/or logic devices, may not be suitable for use in fabricating devices that utilize correlated electron materials.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
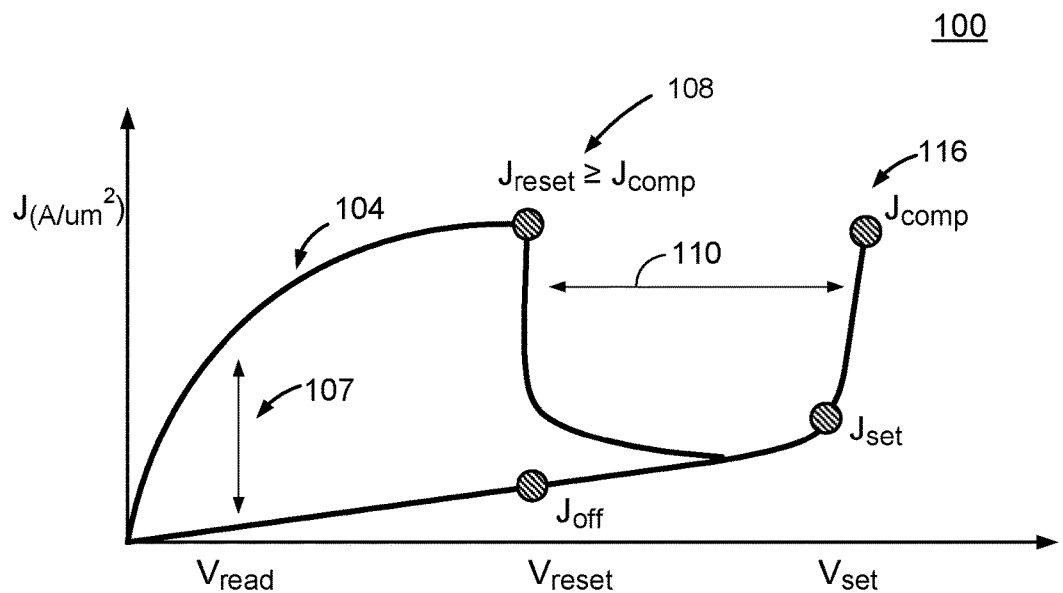
FIG. 1A is an illustration of an embodiment showing current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM) in memory and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects. In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is differentiated from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is differentiated from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is differentiated from the relatively higher impedance state.

Further, in an embodiment, switching from a relatively insulative/higher impedance state to a relatively conductive/ lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM device may comprise one or more materials selected from a group comprising aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, which may establish and/or stabilize variable impedance properties. Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), fluorine (F), chlorine (Cl), bromine (Br), cyanide (CN), sulfur (S), hydroxyl ($OH^-$), and others.

In another embodiment, the CEM device of FIG. 1A may comprise other transition metal oxide variable impedance materials, such as nitrogen-containing ligands, though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In particular embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally-applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C corresponds to a constant.

According to an embodiment, an electrical current, or a density of electrical current, in region 104 of the voltage versus current density profile shown in FIG. 1A, may exist in response to injection of holes from a voltage signal applied across terminals of a CEM device. Here, injection of holes may meet a Mott transition criterion for a low-impedance state to a high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ corresponds to charged injected (holes or electrons) and may be a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $A_{CEM}$ corresponds to a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

Figure 1B:
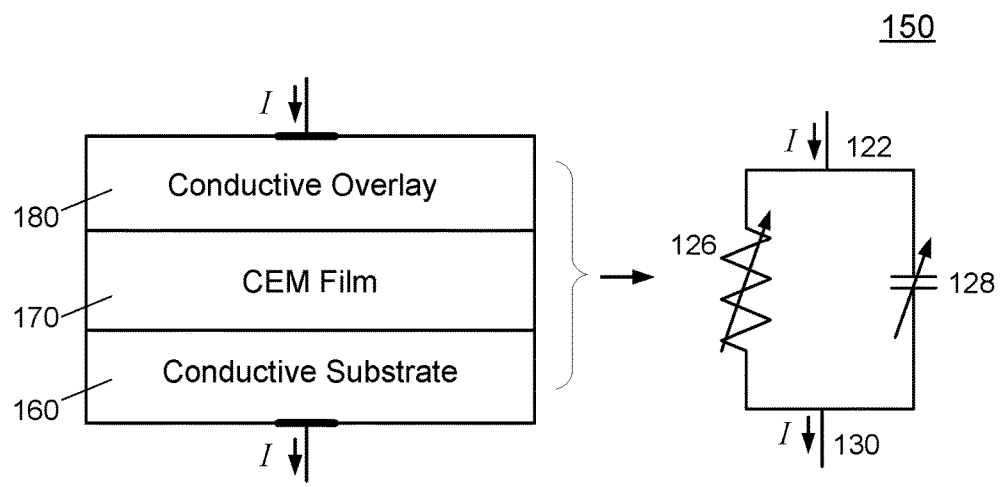
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a conductive substrate 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1 below depicts an example truth table for an example variable impedance device, such as the device of embodiment 150.

TABLE 1

| Correlated Electron Switch Truth Table | | |
|---|---|---|
| Resistance | Capacitance | Impedance |
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 150, may transition between a low-impedance state and a high-impedance state as a function at least partially dependent on a voltage applied across the CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across the CEM device.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:NH₃), thereby permitting the nickel oxide material to switch to transition to a high-impedance property, during device operation.

Thus, in this context, a back-donating material refers to a material that exhibits an impedance switching property, such as switching from a first impedance state to a second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+ (e.g., $Ni^{2+}$ in a material, such as NiO:CO or NiO:NH₃). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reaction, substantially in accordance with expression (4), below:

$$2Ni^{2+} \rightarrow Ni^{1+} + Ni^{3+} \tag{4}$$

Such disproportionation, in this instance, refers to formation of nickel ions as $Ni^{1+}+Ni^{3+}$ as shown in expression (4), which may bring about, for example, a relatively high-impedance state during operation of the CEM device. In an embodiment, a "dopant" such as a carbon-containing ligand, carbonyl (CO) or a nitrogen-containing ligand, such as ammonia (NH₃), carbon, carbonyl, a carbon-containing species, nitrogen, ammonia, chlorine, fluorine, bromine, sulfur, iodine, nitric oxide, nitrous oxide, cyanide, hydroxyl, or a species of form $C_xH_yO_zN_a$ wherein x, y, z, a≥0 and wherein one or more of the set {x, y, z, a} is >0 to correspond to molecules formed from one or more of: C, H, O, N. Use of a dopant in a CEM may permit sharing of electrons during operation of the CEM device so as to give rise to the disproportionation reaction of expression (4), and its reversal, substantially in accordance with expression (5), below:

$$Ni^{1+}+Ni^{3+} \rightarrow 2Ni^{2+} \tag{5}$$

As previously mentioned, reversal of the disproportionation reaction, as shown in expression (5), permits nickel-based CEM to return to a relatively low-impedance state.

In embodiments, depending on a molecular concentration of NiO:CO or NiO:NH₃, for example, which may vary from values approximately in the range of an atomic or molecular percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic or molecular concentration of a back-donating material, such as NiO:CO or NiO:NH₃ and other materials present in the CEM device, as well as other process variations, and claimed subject matter is not limited in this respect.

In certain embodiments, atomic layer deposition may be utilized to form or to fabricate films comprising NiO materials, such as NiO:CO or NiO:NH₃, to permit electron back-donation during operation of the CEM device in a circuit environment, for example, to give rise to a low-impedance state. Also during operation in a circuit environment, for example, electron back-donation may be reversed, which may give rise to a high-impedance state, for example. In particular embodiments, atomic layer deposition may utilize two or more precursors to deposit components of, for example, NiO:CO or NiO:NH₃, or other transition metal oxide, transition metal, or combination thereof, onto a conductive substrate. In an embodiment, layers of a CEM device may be deposited utilizing separate precursor molecules, AX and BY, according to expression (6a), below:

$$AX_{(gas)} + BY_{(gas)} = AB_{(solid)} + XY_{(gas)} \tag{6a}$$

Wherein "A" of expression (6a) corresponds to a transition metal, transition metal compound, transition metal oxide, or any combination thereof. In embodiments, a transition metal oxide may comprise nickel, but may comprise other transition metals, transition metal compound, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO₃).

In embodiments, "X" of expression (6a) may comprise a ligand, such as organic ligand, comprising amidinate (AMD), dicyclopentadienyl (Cp)₂, diethylcyclopentadienyl (EtCp)₂, Bis(2,2,6,6-tetramethylheptane-3,5-dionato) ((thd)₂), acetylacetonate (acac), bis(methylcyclopentadienyl) ((CH₃C₅H₄)₂), dimethylglyoximate (dmg)₂, 2-amino-pent-2-en-4-onato (apo)₂, (dmamb)₂ where dmamb=1-dimethylamino-2-methyl-2-butanolate, (dmamp)2 where dmamp=1-dimethylamino-2-methyl-2-propanolate, Bis(pentamethylcyclopentadienyl) (C₅(CH₃)₅)₂ and carbonyl (CO)₄. Accordingly, in some embodiments, nickel-based precursor AX may comprise, for example, nickel amidinate (Ni(AMD)), nickel dicyclopentadienyl (Ni(Cp)₂), nickel diethyl cyclopentadienyl (Ni(EtCp)₂), Bis(2,2,6,6-tetramethylheptane-3,5-dionato)Ni(II) (Ni(thd)₂), nickel acetylacetonate (Ni(acac)₂), bis(methylcyclopentadienyl)nickel (Ni (CH₃C₅H₄)₂, Nickel dimethylglyoximate (Ni(dmg)₂), Nickel 2-amino-pent-2-en-4-onato (Ni(apo)₂), Ni(dmamb)₂ where dmamb=1-dimethylamino-2-methyl-2-butanolate, Ni(dmamp)₂ where dmamp=1-dimethylamino-2-methyl-2-propanolate, Bis(pentamethylcyclopentadienyl) nickel (Ni (C₅(CH₃)₅)₂, and nickel carbonyl (Ni(CO)₄), just to name a few examples. In expression (6a), precursor "BY" may comprise an oxidizer, such as oxygen (O₂), ozone (O₃), nitric oxide (NO), hydrogen peroxide (H₂O₂), just to name a few examples. In other embodiments as will be described further herein, plasma may be used with an oxidizer to form oxygen radicals.

However, in particular embodiments, a dopant comprising a back-donating material in addition to precursors AX and BY may be utilized to form layers of the CEM device. An additional dopant ligand comprising a back-donating material, which may co-flow with precursor AX, may permit formation of back-donating compounds, substantially in accordance with expression (6b), below. In embodiments, a dopant comprising a back-donating material, such as ammonia ($NH_3$), methane ($CH_4$), carbon monoxide (CO), or other material may be utilized, as may other ligands comprising carbon or nitrogen or other dopants comprising back-donating materials listed above. Thus, expression (6a) may be modified to include an additional dopant ligand comprising a back-donating material substantially in accordance with expression (6b), below:

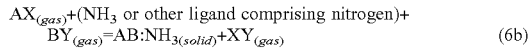

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentration, of precursors, such as AX, BY, and $NH_3$ (or other ligand comprising nitrogen) of expressions (6a) and (6b) may be adjusted so as to bring about a final atomic concentration of nitrogen or carbon dopant comprising a back-donating material in a fabricated CEM device, such as in the form of ammonia ($NH_3$) or carbonyl (CO) comprising a molecular concentration of between approximately 0.1% and 10.0%. However, claimed subject matter is not necessarily limited to the above-identified precursors and/or atomic or molecular concentrations. Rather, claimed subject matter is intended to embrace all such precursors utilized in atomic layer deposition, chemical vapor deposition, hybrid chemical/atomic layer deposition or pulsed chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition or the like, utilized in fabrication of CEM devices. In expressions (6a) and (6b), "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer (BY) to form oxygen radicals. Likewise, plasma may be used with the doping species comprising a back-donating material to form an activated species to control the atomic or molecular concentration of the CEM dopant.

In particular embodiments, such as embodiments utilizing atomic layer deposition, a substrate may be exposed to precursors, such as AX and BY, as well as dopants comprising back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:$NH_3$, for example, is performed, chamber temperature ranges approximately in the range of 20.0° C. and 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression (6(a)) or a single three-precursor cycle (e.g., AX, $NH_3$, $CH_4$, or other ligand comprising nitrogen, carbon or other dopant comprising a back-donating material, and BY, as described with reference to expression 6(b)) utilizing atomic layer deposition may bring about a CEM device layer comprising a thickness approximately in the range of 0.6 Å to 5.0 Å per cycle). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 5.0 Å, 100 two-precursor cycles, for example. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, $NH_3$, $CH_4$ or other ligand comprising nitrogen, carbon or other dopant comprising a back-donating material and BY), of atomic layer deposition, a CEM device film may undergo in situ annealing, which may permit improvement of film properties or may be used to incorporate the dopant comprising a back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In embodiment 150, electrical switching of a CEM device may be inclined to occur at or near an interface between a conductive material and a CEM film, such as at or near a boundary of CEM film 170 and conductive substrate 160. However, in particular embodiments, it may be advantageous to bring about, or to at least initiate, switching at a location within CEM film 170 that is some distance from a boundary of a conductive substrate. In one example, a surface of conductive substrate 160, such as a surface between a conductive substrate 160 and CEM film 170, may comprise a relatively rough, irregular, or jagged boundary. Thus, performing switching functions in the midst of irregular or rough surfaces of a conductive substrate may give rise to increases in resistance and/or filament forming at a boundary between, for example, CEM film 170 and conductive substrate 160. In another example, performing switching functions proximate to irregular or rough surfaces of conductive substrate 160 may bring about increases in capacitance (e.g., by way of increased charge storage at a surface of conductive substrate 160), which may degrade high-frequency performance of a CEM-based switching device. In other examples, performing a switching operation in a CEM device at or nearby a boundary between a conductive substrate and a CEM material may bring about other undesirable effects, and claimed subject matter is not limited in this respect.

Accordingly, embodiments of claimed subject matter may bring about improvements in operation of CEM-based devices, such as decreased operating resistance and decreased charge storage. Additionally, other benefits may be realized, such as increased device endurance, increased stability of operation, and more predictable current and voltage characteristics. To illustrate, FIG. 2, for example, is an illustration of an embodiment of a device comprising a correlated electron material having a stepped atomic or molecular concentration of a dopant species along with a graph showing dopant species atomic or molecular concentration versus distance from a substrate boundary (200). Beginning with conductive substrate 260, for example, substrate 260 may comprise a titanium-based and/or a titanium-containing substrate, such as titanium nitride (TiN), fabricated in layers, for example, for use in a CERAM switching device or other type of CEM-based device. In other embodiments, conductive substrate 210 may comprise other types of conductive materials, such as titanium nitride, platinum, titanium, copper, aluminum, cobalt, nickel, tungsten, tungsten nitride, cobalt silicide, ruthenium, ruthenium oxide, chromium, gold, palladium, indium tin oxide, tantalum, silver, iridium, iridium oxide or any combination thereof, and claimed subject matter is not limited to any particular composition of conductive substrate material.

In other embodiments, conductive substrate 260 may comprise a tantalum-based and/or a tantalum-containing material, such as tantalum nitride (TaN), formed in layers, for use in a CERAM device or other type of CEM-based device. In embodiments, a TaN substrate may be formed utilizing precursors such as pentakisdimethylamido tantalum (PDMAT), which may comprise carbon. In another embodiment, a TaN substrate may be formed utilizing tantalum ethoxide (TAETO), which may also comprise carbon. In another embodiment, a TaN substrate may be formed utilizing tantalum pentachloride ($TaCl_5$). In other embodiments, conductive substrate 260 may comprise a tungsten-based and/or a tungsten-containing material formed in layers, such as tungsten-nitride (WN), for example, for use in a CERAM device or other type of CEM-based device. In embodiments, a WN substrate may be formed utilizing precursors such as tungsten hexacarbonyl ($W(CO)_6$) and/or cyclopentadienyltungsten(II) tricarbonyl hydride. In another embodiment, a WN substrate may be formed utilizing triamminetungsten tricarbonyl (($NH_3$)3W$(CO)_3$) and/or tungsten pentacarbonyl methylbutylisonitrile ($W(CO)5(C_5H_{11}NC)$).

Figure 2:
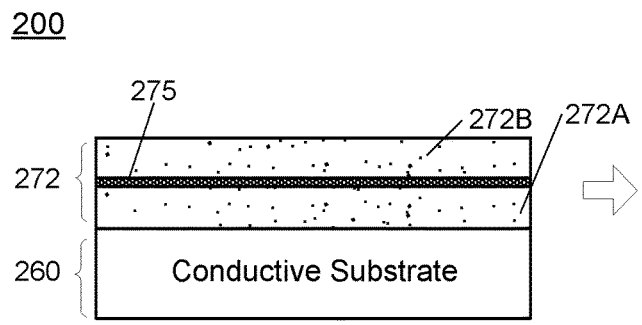
FIG. 2 is an illustration of an embodiment of a device comprising a correlated electron material having a stepped atomic or molecular concentration of a dopant species along with a graph showing dopant species atomic or molecular concentration versus distance from a substrate boundary.
Figure 2:
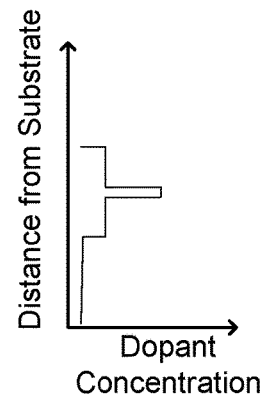

In the embodiment of FIG. 2, CEM film 272 may be deposited on conductive substrate 260. In embodiments, CEM film 272 may be deposited in layers utilizing, for example, an atomic layer deposition process to fabricate films comprising nickel oxide materials, such as NiO:CO or NiO:$NH_3$, for example. In particular embodiments, diffusion of carbon dopant species atoms may give rise to formation of carbonyl (CO), which may operate to fill oxygen vacancies in, for example, a CEM film comprising NiO to form NiO:CO. In other embodiments, CEM film 272 may comprise a nitrogen-containing dopant species, such as $N_2$, to give rise to formation of $NH_3$, which may also operate to fill oxygen vacancies in CEM film layers 345 of a CEM film comprising NiO, to form NiO:$NH_3$. Such filling of oxygen vacancies, for example, in CEM film layers 345, may bring about electron back-donation in a CEM film. Electron back-donation may be reversed, in a CEM film comprising nickel oxide, such as, NiO:CO, which may thereby permit the CEM film to switch to exhibiting a high-impedance property during device operation.

In particular embodiments, CEM film 272 may comprise one or more layers of CEM having a first atomic or molecular concentration of a dopant species. CEM film 272 may additionally comprise one or more layers of CEM having a second atomic or molecular concentration of a dopant species in which the second concentration is substantially dissimilar to that of a first concentration. In this context, the term "substantially dissimilar" atomic or molecular concentration refers to a ratio of a highly-doped region of the CEM to a atomic or molecular dopant concentration in a remaining portion of the CEM of greater than approximately 1.5:1.0 but less than approximately 100.0:1.0. In the embodiment of FIG. 2, CEM film 272 may include one or more layers of CEM comprising a uniform or fixed concentration value of an atomic or molecular dopant species of, for example, approximately 0.0% to approximately 10.0%, for example. In the embodiment of FIG. 2, CEM film 272 may also include a highly-doped region, which may comprise a uniform or fixed concentration value of a molecular or atomic dopant species that is substantially dissimilar to that of other regions of CEM film 272, such as from approximately 3.0% to approximately 15.0%, for example. In other embodiments, region 275 may comprise a dopant species atomic or molecular concentration approximately in the range of 5.0%-15.0% that is substantially dissimilar to a dopant species atomic or molecular concentration of other regions of CEM film 272, which may comprise a dopant species atomic or molecular concentration approximately in the range of 1.0%-5.0%. It should be noted that claimed subject matter is intended to embrace any range of dopant species atomic or molecular concentrations of a highly-doped region of CEM film 272 that are substantially dissimilar to one or more other regions of CEM film 272.

Also shown in the graph adjacent to conductive substrate 260 and CEM film 272 of FIG. 2, the dopant species atomic or molecular concentration within one or more regions, such as first region 272A, of CEM film 272 may comprise a relatively constant value until reaching a second, region 275 located away from the upper boundary of conductive substrate 260. At region 275, if atomic or molecular concentration of a dopant species may increase to a value or a level that is substantially dissimilar to the dopant species atomic or molecular concentration of first region 272A and second region 272B of CEM film 272. It should be noted that the graph of FIG. 2, and other graphs throughout the specification, are not intended to comprise a precise scales of linear or logarithmic values for dopant species atomic or molecular concentrations but merely to illustrate a stepped or abrupt increase in concentration of a molecular or atomic dopant species at a relatively region 275.

Figure 3:
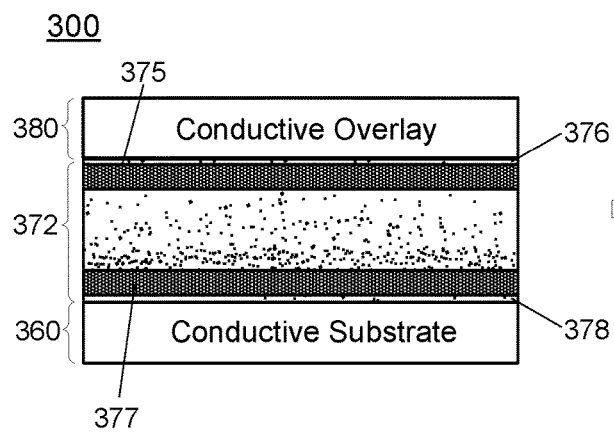
FIG. 3 is an illustration of an embodiment of a CEM device stack comprising a correlated electron material having a stepped and a graded atomic or molecular concentration of a dopant species along with a graph showing a dopant species atomic or molecular concentration versus distance from a substrate boundary.
Figure 3:
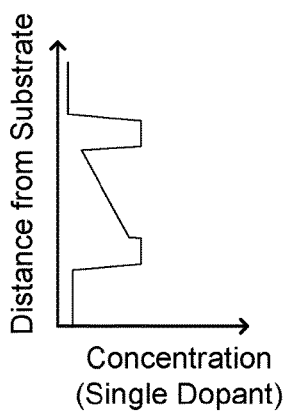

FIG. 3 is an illustration of an embodiment 300 of a CEM stack comprising a correlated electron material having a stepped and a graded atomic or molecular concentration of a dopant species along with a graph showing an atomic or molecular concentration of a dopant species versus distance from a substrate boundary. Beginning with conductive substrate 360, which may be similar to conductive substrate 260, of FIG. 2, substrate 360 may comprise a titanium-based or a titanium-containing substrate, or may comprise other materials such as titanium nitride, platinum, titanium, copper, aluminum, cobalt, nickel, tungsten, tungsten nitride, cobalt silicide, ruthenium, ruthenium oxide, chromium, gold, palladium, indium tin oxide, tantalum, silver, iridium, iridium oxide or any combination thereof, and so forth. Conductive overlay 380 of FIG. 3 may be formed from materials similar to those utilized to form conductive substrate 360. However, in other embodiments, conductive overlay 380 may be formed from materials that differ from those used to construct conductive substrate 360, and claimed subject matter is not limited in this respect. CEM film 372, which lies between conductive overlay 380 and conductive substrate 360, may comprise materials similar to those used in the construction of CEM film 272 of FIG. 2, such as, for example, nickel oxide materials (e.g., NiO:CO, NiO:NH$_3$, and so forth). As shown in the graph adjacent to the CEM stack of FIG. 3, conductive overlay 380 and conductive substrate 360 comprises a relatively low or negligible concentration of an atomic or molecular dopant species.

As shown in FIG. 3, region 377 is disposed a short distance from a boundary of conductive substrate 360. In FIG. 3, intervening region 378, which lies between region 377 and a surface of conductive substrate 360, may comprise a thickness of, for example, approximately 1.0 Å to approximately 10.0 Å. However, in particular embodiments, intervening region 378 may comprise a thickness of approximately 5.0 Å, and claimed subject matter is not limited to any particular dimensions of intervening region 378. In FIG. 3, intervening region 378 comprises a graded dopant species concentration profile that varies within a portion of an atomic or molecular dopant concentration range of approximately 3.0% to approximately 15.0%, for example. In embodiments, atomic or molecular dopant concentration varies with distance from a boundary of conductive substrate 360 before approaching a relative maximum at region 377. Atomic or molecular dopant species concentration within region 377 remains approximately constant with respect to distance from a boundary of conductive substrate 360. Beginning at an upper boundary of region 377, atomic or molecular dopant species concentration gradually decreases as a distance from a boundary of conductive substrate 360 increases. In particular embodiments, a thickness of a relatively highly-doped region, such as region 377, for example, may comprise approximately 25.0-75.0 Å. In a particular embodiment, a thickness of region 377 may approximate, for example, 50.0 Å, although claimed subject matter is not limited in this respect.

As shown in FIG. 3, a region of CEM film 372 that lies between relatively regions 377 and 375 comprises atomic or molecular dopant species concentration profile that gradually decreases with increasing distance from a boundary of conductive substrate 360. A dopant species concentration profile of CEM film may abruptly increase at relatively highly-doped region 375. Region 375 may comprise a thickness of approximately 25.0-75.0 Å, although claimed subject matter is not limited to any particular thickness of the region, such as, for example, a highly-doped region In certain embodiments, a portion of a CEM film that lies between regions 377 and 375 may comprise a thickness of, for example, approximately 50.0 Å to 500.0 Å, for example.

In particular embodiments, a CEM film between regions may comprise a thickness approximately in the range of 200 Å to 400 Å, and claimed subject matter is not limited in this respect. Intervening region 376, which lies between region 375 and a surface of conductive overlay 380 may comprise a thickness of for example, approximately 1.0 Å to 10.0 Å. However, in particular embodiments, intervening region 376 may comprise a thickness of approximately 5.0 Å, and claimed subject matter is not limited to any particular dimension of intervening region 376.

Figure 4:
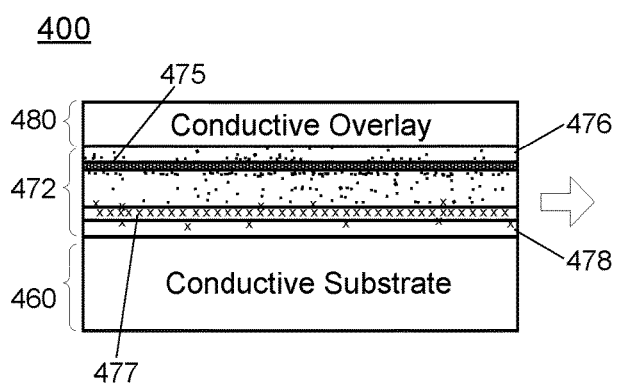
FIGS. 4-5 are illustrations of embodiments of a CEM device stacks comprising correlated electron materials having two dopant species atomic or molecular concentrations along with graphs showing dopant species atomic or molecular concentrations versus distance from a substrate boundary.
Figure 4:
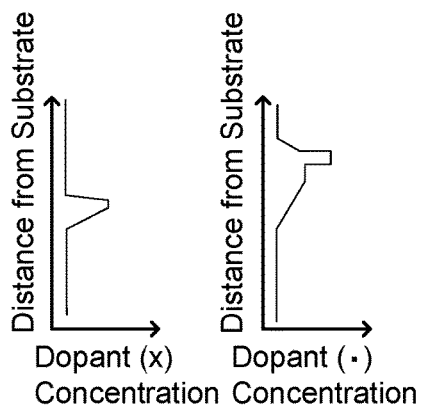

FIG. 4 is an illustration of an embodiment 400 of a CEM device stack comprising correlated electron materials having two atomic or molecular dopant species concentrations along with a graph showing concentrations of atomic or molecular dopant species versus distance from a substrate boundary. Beginning with conductive substrate 460, which may be similar to conductive substrates 260 and 360, of FIGS. 2 and 3, substrate 460 may comprise a titanium-based or a titanium-containing substrate or may comprise other materials such as titanium nitride, platinum, titanium, copper, aluminum, cobalt, nickel, tungsten, tungsten nitride, cobalt silicide, ruthenium, ruthenium oxide, chromium, gold, palladium, indium tin oxide, tantalum, silver, iridium, iridium oxide or any combination thereof. Conductive overlay 480 of FIG. 4 may be formed from materials similar to those utilized to construct conductive substrate 460. However, in particular embodiments, conductive overlay 480 may be formed from materials that differ from those used to fabricate conductive substrate 460, and claimed subject matter is not limited in this respect. CEM film 472, which lies between conductive overlay 480 and conductive substrate 460, may comprise materials similar to those used to construct a CEM film 272 and 372, such as, for example, nickel oxide materials, such as NiO:CO, NiO:NH$_3$, etc. As shown in the graph adjacent the CEM stack of FIG. 4, conductive overlay 480 and conductive substrate 460 comprises a relatively low, or negligible, concentration of an atomic or molecular dopant species.

As shown in FIG. 4, region 477 is disposed a short distance from a boundary of conductive substrate 460. In one embodiment, intervening region 478, which lies between region 477 (shown as comprising dopant species "x") and a boundary of conductive substrate 460, may comprise a thickness of approximately 1.0 Å to approximately 10.0 Å, for example. In a particular embodiment, intervening region 478 may comprise a thickness of approximately 5.0 Å, and claimed subject matter is not limited to any particular dimension of intervening region 478. Intervening region 478 may comprise, for example, and increasing, such as a steeply increasing, atomic or molecular dopant species concentration profile that approaches a relative maximum at region 477. Atomic or molecular dopant species concentration within region 477 may remain approximately constant before abruptly dropping in concentration as a distance from a surface of conductive substrate 460 increases. In a particular embodiment, a thickness of region 477 may comprise approximately 25.0 Å to 75.0 Å. In a particular embodiment, a thickness of region 477 may approximate, for example, and 50.0 Å, although claimed subject matter is not limited in this respect.

As shown in FIG. 4, a region of CEM film 472 disposed over region 477 comprises a relatively low or negligible concentration of dopant species "x," which may represent, for example, ammonia (NH$_3$). However, beginning at the boundary of conductive substrate 460 and CEM film 472, concentration of dopant species "■," which may represent, for example, carbonyl (CO), gradually increases, such as within a portion of a dopant species concentration range of approximately 3.0% to approximately 15.0%. Dopant species concentration may vary with increasing distance from a boundary of conductive substrate 460. In embodiments, a concentration of dopant species "■" increases from a relatively low or negligible value before approaching and approximately constant, higher value. At region 475, concentration of dopant species "■" abruptly increases to approach a relative maximum value before abruptly decreasing with increasing distance from boundary of conductive substrate 460. At intervening region 476, which lies between region 475 and a boundary of conductive overlay 480, concentration of dopant species "■" steeply decreases. At a lower boundary of conductive overlay 480, concentration of dopant species "■" comprises a relatively low or negligible value, which continues into conductive overlay 480.

Figure 5:
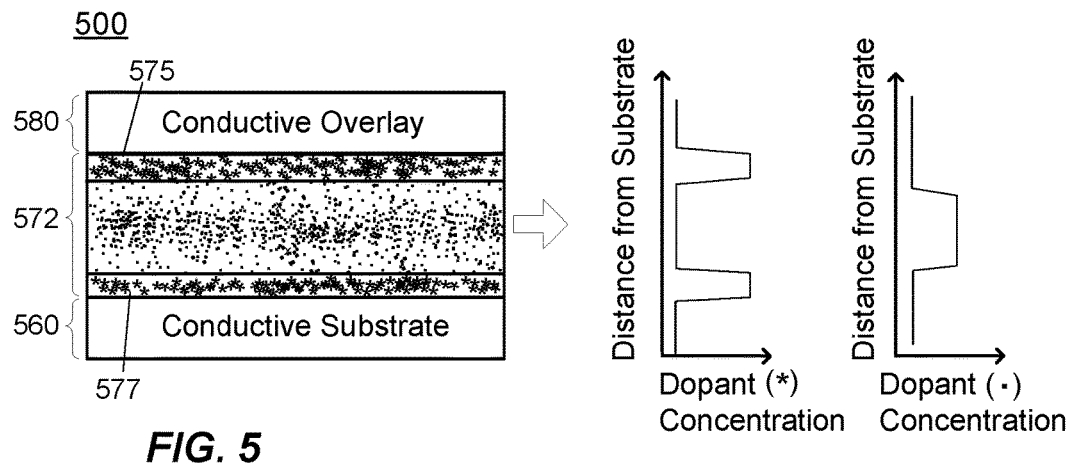

FIG. 5 is an illustration of an embodiment 500 of a CEM device stack having two dopant species atomic or molecular concentrations along with graphs showing dopant species concentrations versus distance from a substrate boundary. Beginning with conductive substrate 560, which may be similar to one or more conductive substrates previously described herein (e.g., 260, 360, 460) substrate 560 may comprise materials that do not include a significant concentration of an atomic or molecular dopant species "*" or dopant species "■," for example. In an embodiment, an upper boundary of conductive substrate 560 may contact region 577 of CEM film 572, which may comprise a nearly abrupt or steep graded transition from a region comprising a very low concentration of dopant species "*" to a substantially dissimilar dopant species concentration.

In particular embodiments, relatively region 577 may comprise a thickness of approximately in the range of 25.0 Å to 75.0 Å, although claimed subject matter is not limited in this respect. In the embodiment of FIG. 5, a region of the CEM film 572 between regions 577 and 575 may comprise a relatively low (such as approximately 3.0%, for example) or a negligible concentration (such as less than approximately 3.0%, for example) of an atomic or molecular dopant species "*," but may comprise a graded, such as a steeply graded, concentration of dopant species "■," such as a concentration of less than approximately 3.0% and increases to a concentration of approximately 15.0%, for example. Concentration of dopant species "■" may comprise a relatively constant value near a center region of CEM film 572 before decreasing in a region that approaches region 575. Within conductive overlay 580, concentration of dopant species "*" and "■" may comprise a low or negligible value.

A CEM film comprising two or more distinct molecular or atomic dopant species, such as described with reference to FIG. 5 may be particularly useful in applications that may benefit from a CEM comprising high dopant species concentrations without saturating a CEM film with any single dopant species. In such an instance, two or more dopant species may be utilized, which may provide benefits of a relatively highly-doped CEM without saturating a CEM with a dopant species.

Figure 6A:
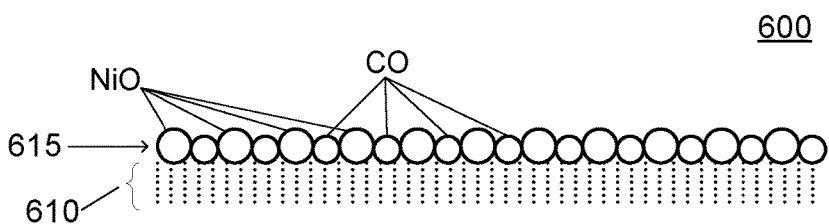
FIGS. 6A-6B is an illustration of an embodiment of a monolayer and a submonolayer of a correlated electron material film.
Figure 6B:
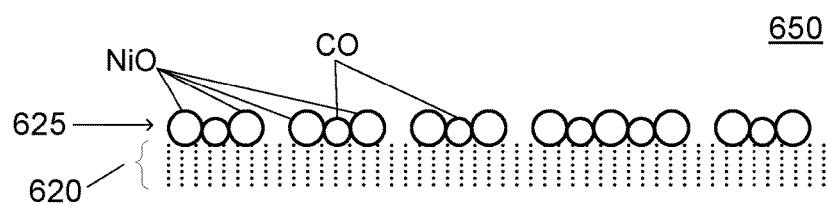

FIGS. 6A-6B is an illustration of an embodiment of a monolayer and a submonolayer of a CEM film. A CEM film of FIG. 6A may comprise, for example, a NiO material, or other suitable material, and claimed subject matter is not limited in this respect. In an embodiment 600, layers 610 represent layers of a CEM film deposited using, for example, atomic layer deposition, although claimed subject matter is not limited to any particular approach toward fabricating layers 610 of a CEM film. In FIG. 6A, NiO molecules, for example, are shown as bonded to CO molecules to form NiO:CO complexes of a CEM layer, wherein CO may operate as a dopant species. As shown in FIG. 6A, an approximate 1.0:1.0 correspondence exists between NiO molecules and CO molecules of layer 615. Accordingly, layer 615 may represent a monolayer, which may refer to a CEM layer having an approximate 1.0:1.0 correspondence between NiO molecules and CO molecules. However, claimed subject matter is intended to embrace monolayers of all types of CEM materials having an approximate 1.0:1.0 correspondence between molecules of a CEM and molecules of a dopant species.

In embodiment 650, shown in FIG. 6B, layers 620 represent layers of CEM film deposited using, for example, atomic layer deposition, but may be deposited using any other fabrication approach. In the embodiment of FIG. 6B, fewer CO molecules of layer 625 are shown as bonded to NiO molecules. Accordingly, layer 625 may represent a submonolayer, which may refer to a CEM layer having less than an approximate 1.0:1.0 correspondence between NiO and CO molecules. However, claimed subject matter is intended to embrace submonolayers of all types of CEM materials having less than an approximate 1.0:1.0 correspondence between molecules of the CEM and molecules of a dopant species.

As previously mentioned, a relatively highly-doped region, such as relatively highly-doped regions previously described herein, for example, may comprise a thickness of between approximately 1.0 Å to approximately 10.0 Å. However, in particular embodiments, a relatively highly-doped region may comprise a single monolayer, such as monolayer 615, of a dopant species. In other embodiments, a relatively highly-doped region may comprise a single sub monolayer, such as monolayer 625, of a dopant species. In embodiments, an annealing process may operate to diffuse a dopant species, such as CO of monolayer 615, to form one or more submonolayers, such as submonolayer 625.

Figure 7A:
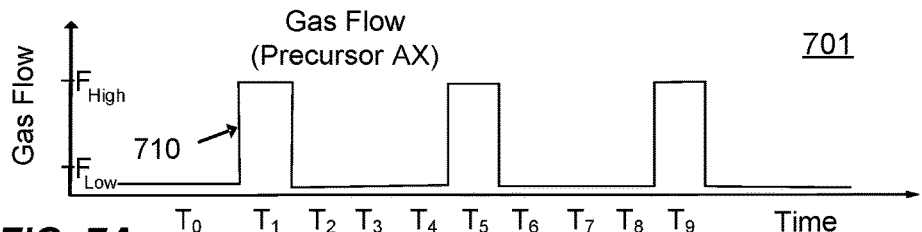
FIGS. 7A-7E and 8A-8E are diagrams showing gas flows and temperature profiles, as a function of time, which may be used in a method for fabricating correlated electron material devices according to an embodiment.

FIGS. 7A-7E are diagrams showing gas flows and temperature profiles, as a function of time, which may be used in a method for fabricating correlated electron material devices according to an embodiment 701. A common timescale ($T_0 \rightarrow T_9$) is utilized for FIGS. 7A-7E. FIG. 7A shows a gas flow profile 710 for a first precursor, such as gaseous AX, or a mixture of gaseous $AX+NH_3$, for example. As shown in FIG. 7A, flow of one or more first precursor gases may be increased, such as from $F_{Low}$ to $F_{High}$, which may permit the one or more first precursor gases to enter a chamber within which a CEM device may be undergoing fabrication. Thus, in accordance with flow profile 710, at time $T_0$, flow of one or more first precursor gases may comprise a relatively low value ($F_{Low}$), such as a flow of approximately 0.0, or other negligible amount. At time $T_1$, flow of one or more first precursor gases may be increased to relatively higher value ($F_{High}$) at time $T_2$, which may correspond to a time approximately in the range of 1.0 seconds to 120.0 seconds after time $T_1$, first precursor gases gas are evacuated from the chamber, such as by purging, for example. A flow of first precursor gases may be returned to a relatively low value, such as approximately 0.0, until approximately time $T_5$, at which time a flow of first precursor gases may be increased to a relatively higher value ($F_{High}$). After time $T_5$, such as at times $T_6$ and $T_7$, a flow of the first precursor gases may be returned to a relatively low value until increased at a later time.

Figure 7B:
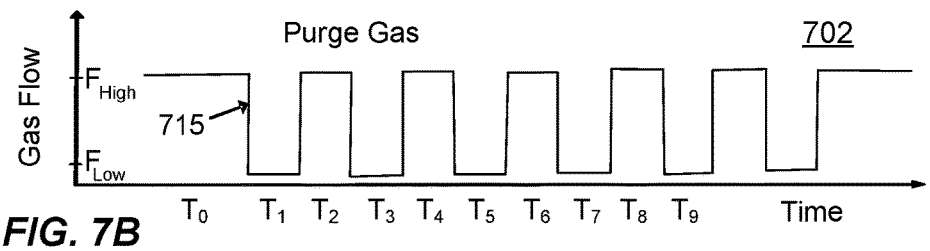

FIG. 7B shows a gas flow profile 715 for a purge gas, according to an embodiment 702. As shown in FIG. 7B, purge gas flow may be increased and decreased so as to permit evacuation of the fabrication chamber of the first precursor gas (AX) and a second precursor gas (BY), for example. At time $T_0$, purge gas profile 720 indicates a relatively high purge gas flow, which may permit removal of impurity gases within the fabrication chamber prior to time $T_1$. At time $T_1$, purge gas flow may be reduced to approximately 0.0, which may permit introduction of first precursor AX gas into the fabrication chamber. At time $T_2$, purge gas flow may be increased for duration approximately in the range of 0.5 seconds to 180.0 seconds so as to permit removal of excess precursor gas AX and reaction byproducts from the fabrication chamber.

Figure 7C:
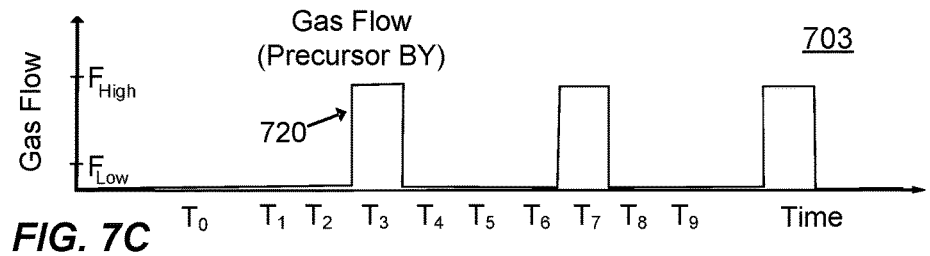

FIG. 7C shows a gas flow profile 720 for a precursor gas (e.g., BY), according to an embodiment 703. As shown in FIG. 7C, precursor BY gas flow may remain at a flow of approximately 0.0 $m^3$/sec, until approximately time $T_3$, at which gas flow may be increased to relatively higher value. At time $T_4$, which may correspond to a time approximately in the range of 0.5 seconds to 180.0 seconds after time $T_2$, precursor BY gas may be purged and/or evacuated from the chamber, such as by purging, for example. Precursor BY gas flow may be returned to 0.0 $m^3$/sec, until approximately time $T_7$, at which time precursor BY gas flow may be increased to a relatively higher value.

Figure 7D:
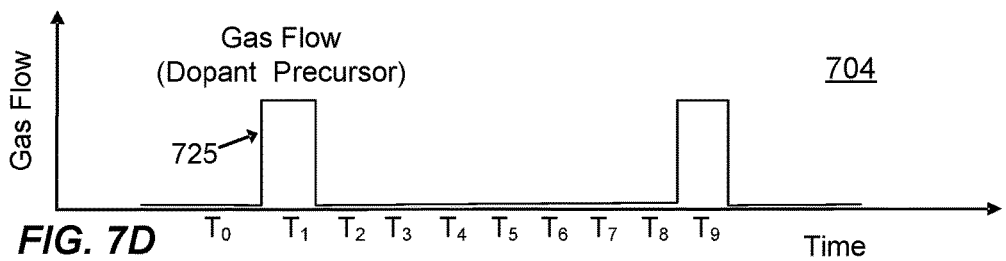

FIG. 7D shows a gas flow profile 725 for a precursor gas comprising a dopant species such as carbon, nitrogen, fluoride (F), chloride (Cl), bromide (Br), cyanide (CN), sulfur (S), for example, according to an embodiment 704. As shown in FIG. 7D, flow of a precursor gas comprising a dopant species may remain at a flow rate of approximately 0.0 $m^3$/sec, until approximately time $T_1$, at which flow of precursor gas may be increased to a relatively higher value. At time $T_2$, which may correspond to a time approximately in the range of 0.5 seconds to 180.0 seconds after time $T_1$, a precursor gas comprising a dopant species may be purged and/or evacuated from the chamber, for example. Flow of a precursor gas comprising a dopant species may be returned to 0.0 $m^3$/sec, until approximately time $T_9$, at which time a flow of a precursor gas may be increased to a relatively higher value.

Figure 7E:
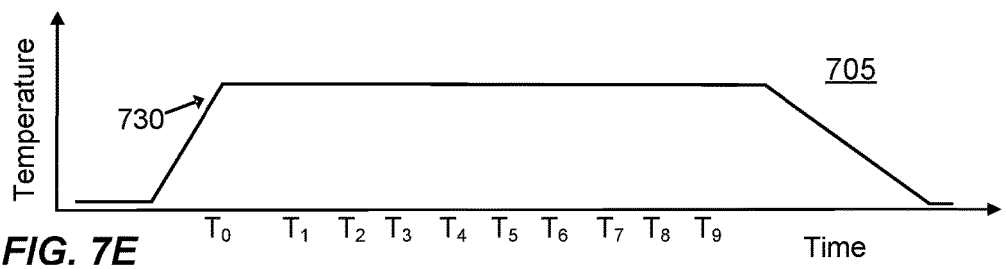

FIG. 7E is a diagram showing a temperature profile 730, as a function of time, used in a method for fabricating correlated electron device materials according to an embodiment 705. In FIG. 7E, a deposition temperature may be raised to attain a temperature of, for example, a temperature approximately in the range of 20.0° C. to 900.0° C. However, in particular embodiments, somewhat smaller ranges may be utilized, such as temperature ranges approximately in the range of 100.0° C. to 800.0° C. Further, for particular materials, even smaller temperature ranges may be utilized, such as from approximately 100.0° C. to approximately 600.0° C.

Figure 8A:
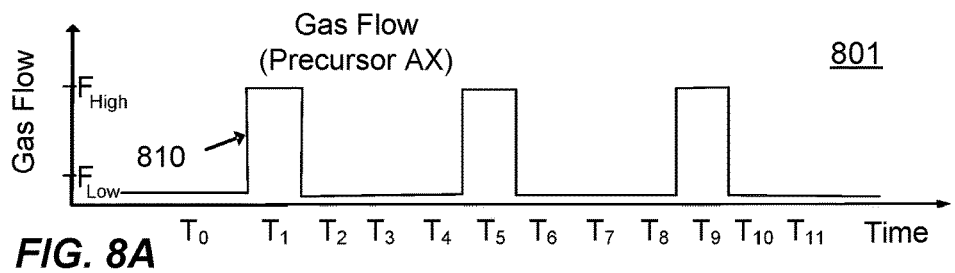

FIGS. 8A-8E are diagrams showing gas flows and temperature profiles, as a function of time, which may be used in a method for fabricating correlated electron material devices according to an embodiment 801. A common timescale ($T_0 \rightarrow T_{11}$) is utilized for FIGS. 8A-8E. FIG. 8A shows a gas flow profile 810 for a first precursor, such as gaseous AX, or a mixture of gaseous AX+$NH_3$, for example. As shown in FIG. 8A, flow of one or more first precursor gases may be increased, such as from $F_{Low}$ to $F_{High}$, which may permit the one or more first precursor gases to enter a chamber within which a CEM device may be undergoing fabrication. Thus, in accordance with flow profile 810, at time $T_0$, flow of one or more first precursor gases may comprise a relatively low value ($F_{Low}$), such as a flow of approximately 0.0, or other negligible amount. At time $T_1$, flow of one or more first precursor gases may be increased to relatively higher value ($F_{High}$). At time $T_2$, which may correspond to a time approximately in the range of 1.0 seconds to 120.0 seconds after time $T_1$, the one or more first precursor gases are evacuated from the chamber, such as by purging, for example. A flow of first precursor gases may be returned to a relatively low value, such as approximately 0.0, until approximately time $T_5$, at which time a flow of first precursor gases may be increased to a relatively higher value ($F_{High}$). After time $T_5$, such as at times $T_6$ and $T_7$, a flow of the first precursor gases may be returned to a relatively low value until increased at a later time.

Figure 8B:
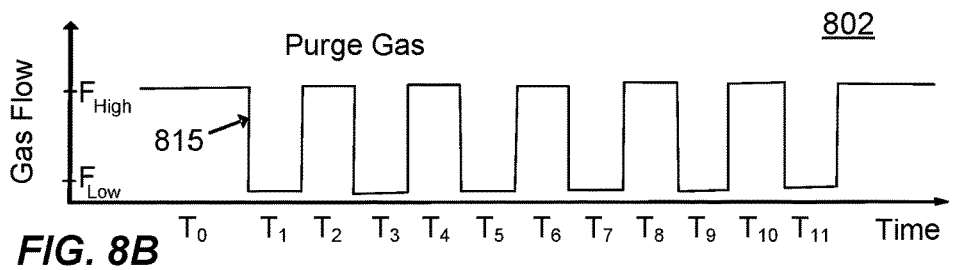

FIG. 8B shows a gas flow profile 815 for a purge gas, according to an embodiment 802. As shown in FIG. 8B, purge gas flow may be increased and decreased so as to permit evacuation of the fabrication chamber of the first precursor gas (AX) and a second precursor gas (BY), for example. At time $T_0$, purge gas profile 815 indicates a relatively high purge gas flow, which may permit removal of impurity gases within the fabrication chamber prior to time $T_1$. At time $T_1$, purge gas flow may be reduced to approximately 0.0, which may permit introduction of first precursor AX gas into the fabrication chamber. At time $T_2$, purge gas flow may be increased for duration approximately in the range of 0.5 seconds to 180.0 seconds so as to permit removal of excess precursor gas AX and reaction byproducts from the fabrication chamber.

Figure 8C:
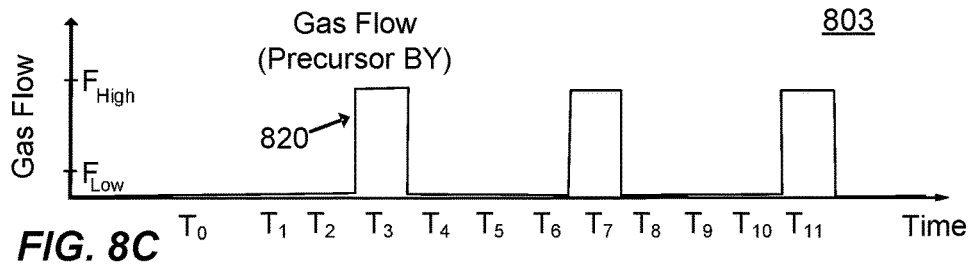

FIG. 8C shows a gas flow profile 820 for a precursor gas (e.g., BY), according to an embodiment 803. As shown in FIG. 8C, precursor BY gas flow may remain at a flow of approximately 0.0 $m^3$/sec, until approximately time $T_3$, at which gas flow may be increased to relatively higher value. At time $T_4$, which may correspond to a time approximately in the range of 0.5 seconds to 180.0 seconds after time $T_2$, precursor BY gas may be purged and/or evacuated from the chamber, such as by purging, for example. Precursor BY gas flow may be returned to 0.0 $m^3$/sec, until approximately time $T_7$, at which time precursor BY gas flow may be increased to a relatively higher value.

Figure 8D:
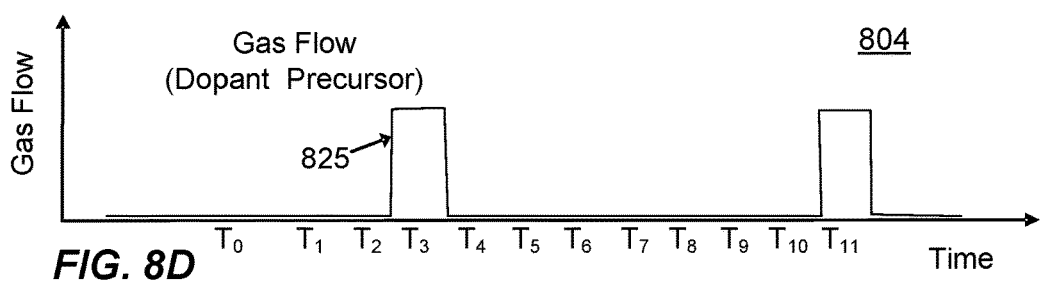

FIG. 8D shows a gas flow profile 825 for a precursor gas comprising a dopant species such as carbon, nitrogen, fluoride (F), chloride (Cl), bromide (Br), cyanide (CN), sulfur (S), for example, according to an embodiment 804. As shown in FIG. 8D, flow of a precursor gas comprising a dopant species may remain at a flow rate of approximately 0.0 $m^3$/sec, until approximately time $T_3$, at which flow of precursor gas may be increased to a relatively higher value. At time $T_4$, which may correspond to a time approximately in the range of 0.5 seconds to 180.0 seconds after time $T_3$, a precursor gas comprising a dopant species may be purged and/or evacuated from the chamber, for example. Flow of a precursor gas comprising a dopant species may be returned to 0.0 $m^3$/sec, until approximately time $T_{11}$, at which time a flow of a precursor gas may be increased to a relatively higher value.

Figure 8E:
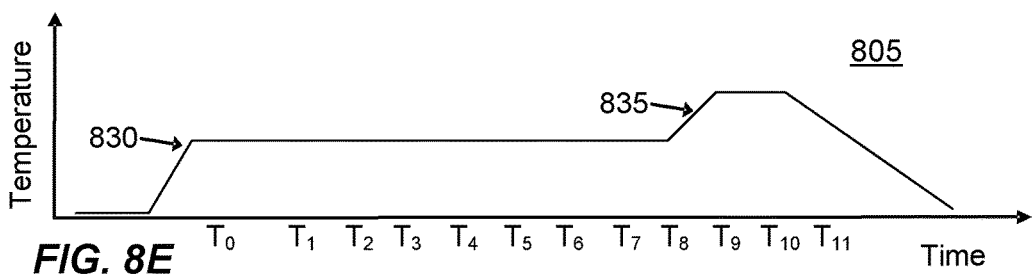

FIG. 8E is a diagram showing a temperature profile 830, as a function of time, used in a method for fabricating correlated electron device materials according to an embodiment 805. In FIG. 8E, a deposition temperature may be raised to attain a temperature of, for example, a temperature approximately in the range of 20.0° C. to 900.0° C. However, in particular embodiments, somewhat smaller ranges may be utilized, such as temperature ranges approximately in the range of 100.0° C. to 800.0° C. Further, for particular materials, even smaller temperature ranges may be utilized, such as from approximately 100.0° C. to approximately 600.0° C. In embodiments, temperature profile 830 may comprise additional rise 835 in temperature, such as after $T_{11}$ to anneal the CEM film, which may permit greater diffusion and dispersion of dopants within a CEM film.

Figure 9:
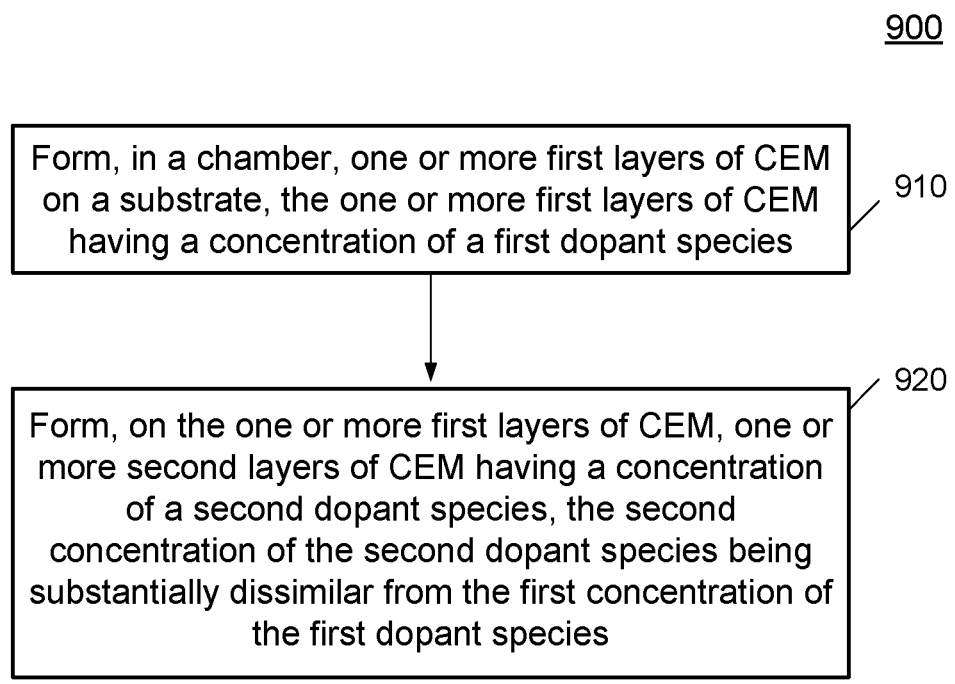
FIG. 9 is a flowchart of an embodiment for a generalized process for fabricating correlated electron films having varying atomic or molecular concentrations of a dopant species.

FIG. 9 is a flowchart of an embodiment for a generalized process for fabricating correlated electron films having varying atomic or molecular concentrations of a dopant species 900. The method may begin at block 910, which may comprise forming, in a chamber, one or more first layers of CEM on the substrate, the one or more first layers of CEM having a concentration of a first doping species. Block 920 may comprise forming, on the one or more first layers of CEM, one or more second layers of CEM having a concentration of a second dopant species the concentration of the second dopant species being substantially dissimilar from the first concentration.

In an embodiment, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a device, comprising:
   forming, in a chamber, one or more first layers of correlated electron material (CEM) over a substrate, the one or more first layers of CEM having a first atomic concentration of a first carbon-containing dopant species; and
   forming, over the one or more first layers of CEM, one or more second layers of CEM having a second atomic concentration of a second carbon-containing dopant species, the second atomic concentration of the second carbon-containing dopant species being substantially dissimilar from the first atomic concentration of the first carbon-containing dopant species.

2. The method of claim 1, wherein the first atomic concentration of the first carbon-containing dopant species comprises approximately 0.0% to approximately 10.0%.

3. The method of claim 1, wherein the second atomic concentration of the second carbon-containing dopant species comprises an approximately fixed value within a range of approximately 3.0% to approximately 15.0%.

4. The method of claim 3, wherein the second atomic concentration of the second carbon-containing dopant species comprises a graded doping profile that varies within a portion of the range of approximately 3.0% to approximately 15.0%.

5. The method of claim 1, wherein the first carbon-containing dopant species and the second carbon-containing dopant species comprise the same dopant species.

6. The method of claim 1, wherein the first carbon-containing dopant species and the second carbon-containing dopant species comprise different molecular or atomic dopant species.

7. The method of claim 1, wherein the first carbon-containing dopant species or the second carbon-containing dopant species comprise elemental carbon, carbonyl, nitrogen, ammonia, chlorine, fluorine, bromine, sulfur, iodine, nitric oxide, nitrous oxide, cyanide, hydroxyl or a species of form $C_xH_yO_zN_a$ wherein x, y, z, a>0 and wherein one or more of the set $\{x, y, z, a\}$ is >0 to correspond to molecules formed from one or more of: C, H, O, N.

8. The method of claim 1, wherein forming the one or more second layers of CEM comprises forming a submonolayer of CEM.

9. The method of claim 8, wherein the submonolayer of CEM comprises CO molecules and NiO molecules.

10. The method of claim 9, wherein a ratio of NiO molecules to CO molecules is approximately 1.0:1.0.

11. The method of claim 9, wherein a ratio of NiO molecules to CO molecules is approximately 2.0:1.0.

12. The method of claim 1, further comprising:
    annealing the one or more first layers of CEM or the one or more second layers of CEM in a chamber.

13. The method of claim 12, wherein annealing the one or more first layers of CEM or the one or more second layers of CEM in the chamber further comprises heating the chamber to a temperature approximately in the range of 20.0 C° to 1000.0 C°.

14. The method of claim 12, wherein annealing the one or more first layers of CEM or the one or more second layers of CEM in the chamber further comprises heating the chamber to a temperature approximately in the range of 100.0 C° to 800.0 C°.

15. The method of claim 12, wherein annealing the one or more first layers of CEM or the one or more second layers of CEM in the chamber further comprises annealing the one or more first layers of CEM or the one or more second layers of CEM while the chamber is maintained at a temperature within a temperature range for a duration approximately in a range of 1.0 seconds to 5.0 hours.

16. The method of claim 12, wherein annealing the one or more first layers of CEM or the one or more second layers of CEM in the chamber further comprises annealing the one or more first layers of CEM or the one or more second layers of CEM while the chamber is maintained at a temperature within a temperature range for a duration approximately in a range of 0.5 minutes to 180.0 minutes.

17. A method of constructing a device, comprising:
 forming, in a chamber, one or more first layers of correlated electron material (CEM) over a substrate, forming the one or more first layers of CEM comprising varying a first atomic concentration of a first carbon-containing dopant species in the one or more first layers of CEM between boundaries of the one or more first layers of CEM according to a gradient; and
 forming, over the one or more first layers of CEM, one or more second layers of CEM, forming the one or more second layers of CEM comprising a maintaining a fixed second atomic concentration of a second carbon-containing species in the one or more second layers of CEM between boundaries of the one or more second layers of CEM.

18. A method of constructing a device, comprising:
 forming, in a chamber, one or more first layers of correlated electron material (CEM) over a substrate, forming the one or more first layers of CEM comprising a maintaining a fixed first atomic concentration of a first carbon-containing species in the one or more first layers of CEM between boundaries of the one or more first layers of CEM and
 forming, over the one or more first layers of CEM, one or more second layers of CEM, forming the one or more second layers of CEM comprising varying a first atomic concentration of a second carbon-containing dopant species in the one or more second layers of CEM between boundaries of the one or more second layers of CEM according to a gradient.

* * * * *